(12) United States Patent
Zhang et al.

(10) Patent No.: US 11,411,582 B1
(45) Date of Patent: Aug. 9, 2022

(54) MACHINE-LEARNING BASED LLR GENERATION WITHOUT ASSIST-READ FOR EARLY-STAGE SOFT DECODING

(71) Applicant: SK hynix Inc., Icheon-si (KR)

(72) Inventors: Fan Zhang, Fremont, CA (US); Aman Bhatia, Los Gatos, CA (US); Meysam Asadi, Fremont, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/150,519

(22) Filed: Jan. 15, 2021

(51) Int. Cl.
| | |
|---|---|
| H03M 13/00 | (2006.01) |
| H03M 13/11 | (2006.01) |
| G06N 3/04 | (2006.01) |
| G06F 11/10 | (2006.01) |
| G06N 3/08 | (2006.01) |

(52) U.S. Cl.
CPC ..... *H03M 13/1111* (2013.01); *G06F 11/1004* (2013.01); *G06F 11/1076* (2013.01); *G06N 3/04* (2013.01); *G06N 3/08* (2013.01)

(58) Field of Classification Search
None
See application file for complete search history.

(56) References Cited

U.S. PATENT DOCUMENTS

| | | | |
|---|---|---|---|
| 9,007,854 B1 * | 4/2015 | Nemati Anaraki | G06F 11/10 365/189.15 |
| 9,450,610 B1 * | 9/2016 | Micheloni | G06F 11/1012 |
| 10,613,927 B1 * | 4/2020 | Symons | H03M 13/45 |
| 10,678,662 B2 | 6/2020 | Zhang | |
| 10,790,860 B2 | 9/2020 | Ismail et al. | |
| 10,861,562 B1 * | 12/2020 | Xiong | G11C 16/26 |

(Continued)

FOREIGN PATENT DOCUMENTS

| | | |
|---|---|---|
| CN | 210129219 U | 3/2020 |
| KR | 20070029889 A | 3/2007 |
| WO | WO-2017166211 A1 | 10/2017 |

OTHER PUBLICATIONS

Daesung Kim, Jinho Choi and Jeongseok Ha, "On the soft information extraction from hard-decision outputs in MLC NAND flash memory," 2012 IEEE Global Communications Conference (GLOBECOM), 2012, pp. 3208-3213, doi: 10.1109/GLOCOM.2012.6503608. (Year: 2012).*

(Continued)

*Primary Examiner* — Daniel F. McMahon
(74) *Attorney, Agent, or Firm* — Weaver Austin Villeneuve & Sampson LLP

(57) ABSTRACT

A method is provided for determining log-likelihood ratio (LLR) for soft decoding based on information obtained from hard decoding, in a storage system configured to perform hard decoding and soft decoding of low-density parity-check (LDPC) codewords. The method includes performing hard decoding of codewords in a page, the hard decoding including a first hard read and one or more re-reads using predetermined hard read threshold voltages, and grouping memory cells in the page into a plurality of bins based on the read threshold voltages for the first hard read and the one or more re-reads. The method also includes computing parity checksum and one's count for memory cells in each bin, and determining LLR for each bin of memory cells based on read data, checksums, and one's count for each bin.

20 Claims, 14 Drawing Sheets

(56) References Cited

U.S. PATENT DOCUMENTS

| | | | |
|---|---|---|---|
| 2013/0275829 A1* | 10/2013 | Sridhara | H03M 13/6325 |
| | | | 714/755 |
| 2014/0281828 A1* | 9/2014 | Micheloni | G06F 11/1048 |
| | | | 714/773 |
| 2015/0331748 A1* | 11/2015 | Cohen | G06F 11/1076 |
| | | | 714/764 |
| 2017/0125114 A1* | 5/2017 | Alhussien | H03M 13/6325 |
| 2019/0286516 A1* | 9/2019 | Jacobvitz | G11C 11/5642 |
| 2019/0379399 A1 | 12/2019 | Varanasi | |
| 2020/0219571 A1 | 7/2020 | Chen et al. | |
| 2020/0220562 A1 | 7/2020 | Tao et al. | |
| 2020/0241959 A1* | 7/2020 | Wang | G06F 11/1012 |
| 2020/0250030 A1 | 8/2020 | Sandell et al. | |
| 2020/0294611 A1 | 9/2020 | Yassine | |
| 2020/0403634 A1* | 12/2020 | Zhang | G06F 11/1072 |

OTHER PUBLICATIONS

Raviv, et al., "Data-Driven Ensembles for Deep and Hard-Decision Hybrid Decoding", 2020 IEEE International Symposium on Information Theory (ISIT), Jun. 21-26, 2020, 6 pages.

Sandell, et al., "Machine learning for LLR estimation in flash memory with LDPC codes", IEEE Transactions on Circuits and Systems II: Express Briefs, Aug. 17, 2020, 5 pages.

* cited by examiner

MACHINE-LEARNING BASED LLR GENERATION WITHOUT ASSIST-READ FOR EARLY-STAGE SOFT DECODING

BACKGROUND OF THE INVENTION

The present invention relates generally to systems and methods for storage devices, and specifically to improving performance of non-volatile memory devices, such as solid-state disks (SSDs).

Solid-state memory is ubiquitously used in a variety of electronic systems, including, for example, consumer electronic devices (e.g., cellular phones, cameras, computers) and in enterprise computing systems (e.g., hard drives, random access memory (RAM)). Solid-state memory has gained popularity over mechanical or other memory storage techniques due to latency, throughput, shock resistance, packaging, and other considerations.

To increase storage density, multi-bit multi-level memory cells are finding increasing usage. As the density increases, the margin for error decreases. Therefore, error-correction codes have become indispensable in solid-state memories. Accordingly, effective and efficient techniques for performing error correction are highly desirable.

SUMMARY OF THE INVENTION

In embodiments of the invention, a method is provided for generating the log-likelihood ratios (LLRs) using information from hard decoding and without assist reads (ARs) that are used in soft decoding. In an embodiment, hard read data, checksums, and one's counts from hard read data are used for generating LLRs to support early-stage soft decoding. This method provides several advantages over the conventional soft decoding process. First, conventional soft read often involves identifying a center or optimal read threshold voltage and deriving additional read threshold voltages for AR designed to obtain sufficient soft information for the determination of LLRs. Therefore, conventional soft decoding using ARs is a more complex process. Additionally, in conventional decoding flow, it is difficult to obtain enough information to generate the LLR table to support early-stage soft decoding.

According to some embodiments of the present invention, a method of decoding low-density parity-check (LDPC) codewords includes performing, by a system that comprises an LDPC decoder, hard decoding of a given page of memory cells associated with a word line (WL), the hard decoding including a first hard read and one or more re-reads using predetermined hard read threshold voltages. The method also includes determining, by the system, that hard decoding based on a hard read has failed. The method further includes determining, by the system, whether the hard read is the first hard read or a re-read of the given page. Upon determining that the hard read is the first hard read, the system proceeds to perform hard decoding of another page. Upon determining that the hard read is the re-read of the given page, the method includes grouping the memory cells of the given page into bins based on read threshold voltages associated with the hard read and previous hard reads of the given page. The method further includes determining parity checksum and one's count for memory cells in each bin, and computing LLR for each bin using machine learning, based on read data, checksum, and one's count for each bin. Soft read and soft decoding of the given page can then be performed using the generated LLRs.

In some embodiments, the method also includes detecting whether a hard read is a first hard read or a re-read using a pattern-matching operation between read data from a current hard read and a previous hard read of the given page. In some embodiments, the pattern-matching operation includes performing a summing operation as follows:

SUM(XOR(incoming_data, saved_data)), wherein:

incoming_data is read data from the current hard read of the given page;
saved_data is read data from the previous hard read of the given page;
XOR is an exclusive OR operation; and
SUM is an operation that determines a sum of 1's bits.

In some embodiments, the parity checksum is based on weights of a non-zero syndrome of the codewords.

In some embodiments, the machine learning comprises using a neural network (NN). In some embodiments, the NN is a deep neural network (DNN) that receives checksums and one's counts as inputs and determines weighting factors for computing optimal LLRs.

According to some embodiments of the present invention, a method is provided for determining LLR for soft decoding based on information obtained from hard decoding, in a storage system configured to perform hard decoding and soft decoding of LDPC codewords. The method includes performing hard decoding of codewords in a page, the hard decoding including a first hard read and one or more re-reads using predetermined hard read threshold voltages, and grouping memory cells in the page into a plurality of bins based on the read threshold voltages for the first hard read and the one or more re-reads. The method also includes computing parity checksum and one's count for memory cells in each bin, and determining LLR for each bin of memory cells based on read data, checksums, and one's count for each bin.

In some embodiments, the method also includes using machine learning to determine the LLR for each bin.

In some embodiments, the machine learning comprises NN.

In some embodiments, the parity checksum comprises weights of a non-zero syndrome of the codewords for LDPC decoding.

In some embodiments, the one's count for a given bin comprises a number of memory cells in the bin that have cell values of 1.

In some embodiments, the method also includes determining the LLR without using an AR, wherein the AR comprises determining an additional read threshold voltage for determining the LLR according to read data from hard reads.

In some embodiments, the method also includes detecting whether a hard read is a first hard read or a re-read using a pattern-matching operation between read data from a current hard read and a previous hard read of the given page.

In some embodiments, the method also includes determining LLR for soft decoding based on information obtained from hard decoding after determining that a hard read of a given page is a re-read of the given page.

According to some embodiments of the present invention, a storage system includes memory cells and a memory controller coupled to the memory cells for controlling operations of the memory cells, including hard decoding and soft decoding of LDPC codewords. The memory controller is configured to perform hard decoding of codewords in a page, the hard decoding including a first hard read and one or more re-reads using predetermined hard read threshold voltages. The memory controller is also configured to group memory cells in the page into a plurality of bins based on the read threshold voltages for the first hard read and the one or more re-reads. The memory controller is further configured to compute parity checksum and one's count for memory cells in each bin, and to determine LLR for each bin of memory cells based on read data, checksums, and one's count for each bin.

In some embodiments of the storage system, the memory controller is further configured to use DNN to determine the LLR for each bin.

In some embodiments of the storage system, the parity checksum includes weights of a non-zero syndrome of the codewords for LDPC decoding.

In some embodiments of the storage system, the one's count for a given bin comprises a number of memory cells in the bin that have cell values of 1.

In some embodiments, the storage system also includes:
  a re-read detection unit configured to detect whether a hard read is a first hard read or a re-read using a pattern matching operation between read data from a current hard read and a previous hard read of a given page; and
  an LLR generation unit configured to determine LLR for soft decoding based on information obtained from hard decoding after determining that a hard read of a given page is a re-read of the given page.

In some embodiments, the re-read detection unit is configured to the pattern-matching operation using a summing operation as follows:
  SUM(XOR(incoming_data, saved_data)),
  wherein:
  incoming_data is read data from the current hard read of the given page;
  saved_data is read data from the previous hard read of the given page;
  XOR is an exclusive OR operation; and
  SUM is an operation that determines a sum of 1's bits.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label with a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Error-correcting codes are frequently used in communications, as well as for reliable storage in media such as CDs, DVDs, hard disks, and RAMs, flash memories, and the like. Error-correcting codes may include LDPC codes, turbo product codes (TPC), Bose-Chaudhuri-Hocquenghem (BCH) codes, Reed Solomon codes, and the like.

Figure 1:
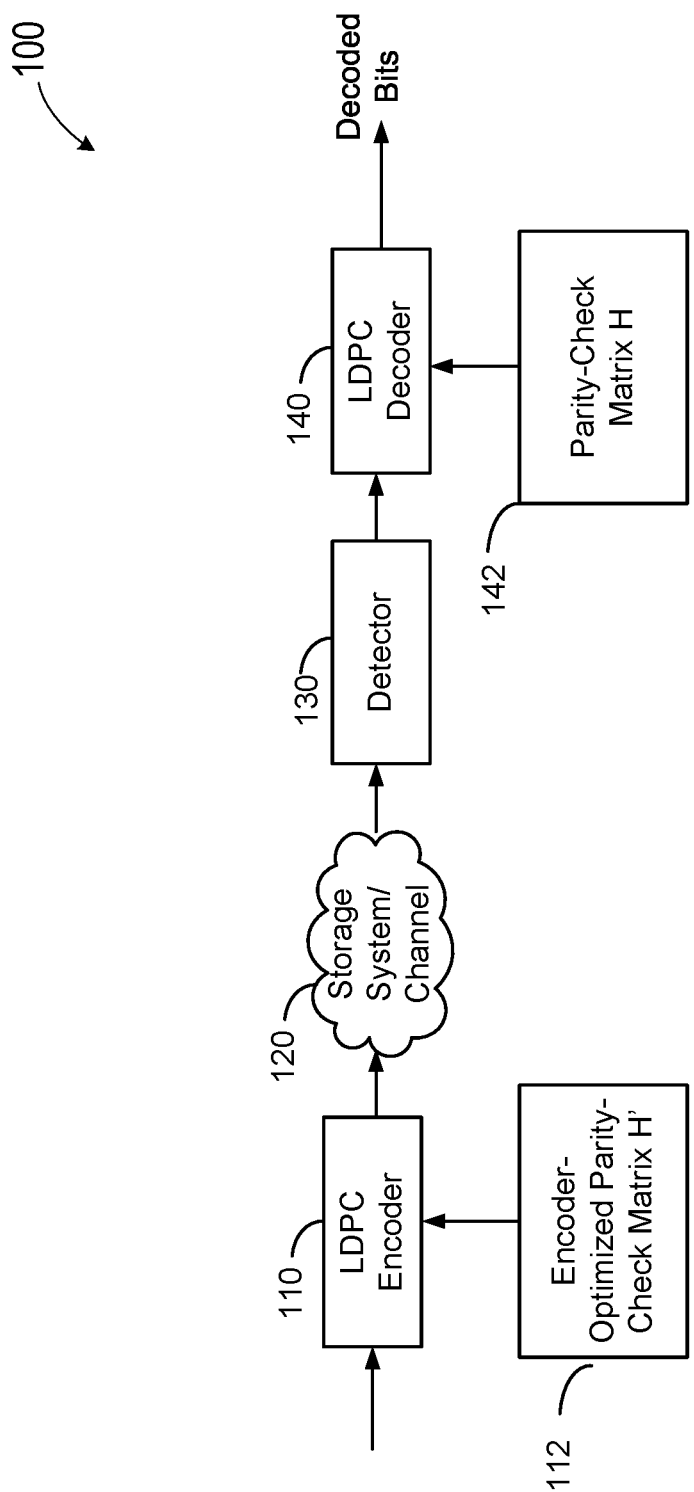
FIG. 1 illustrates an example high-level block diagram of an error-correcting system in accordance with certain embodiments of the present disclosure.

FIG. 1 is a high-level block diagram illustrating an example LDPC error-correcting system in accordance with certain embodiments of the present disclosure. As illustrated in FIG. 1, an LDPC encoder 110 of error-correction system 100 may receive information bits that include data which is desired to be stored in a storage system 120. LDPC-encoded data may be generated by LDPC encoder 110 and may be written to storage system 120. The encoding may use an encoder-optimized parity-check matrix H (112).

In various embodiments, storage system 120 may include a variety of storage types or media. Errors may occur in data storage or communication channels. For example, the errors may be caused by, for example, cell-to-cell interference and/or coupling. When the stored data is requested or otherwise desired (e.g., by an application or user which stored the data), a detector 130 may receive data from storage system 120. The received data may include some noise or errors. Detector 130 may include a soft output detector and a hard output detector and may perform detection on the received data and output decision and/or reliability information.

For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs an LLR where the sign indicates the decision (e.g., a positive value corresponds to a "1" decision and a negative value corresponds to a "0" decision) and the magnitude indicates how certain the detector is in that decision (e.g., a large magnitude indicates a high reliability or certainty).

The decision and/or reliability information may be passed to an LDPC decoder 140 which may perform LDPC decoding using the decision and/or reliability information. A soft LDPC decoder may utilize both the decision and the reliability information to decode the codeword. A hard LDPC decoder may utilize only the decision values from the detector to decode the codeword. The decoded bits generated by LDPC decoder 140 may be passed to an appropriate entity (e.g., the user or application which requested it). The decoding may utilize a parity-check matrix H 142, which may be optimized for LDPC decoder 140 by design. With proper encoding and decoding, the decoded bits would match the information bits. In some implementations, parity-check matrix H 142 may be the same as encoder-optimized parity-check matrix H 112. In some implementations, encoder-optimized parity-check matrix H 112 may be modified from parity-check matrix H 142. In some implementations, parity-check matrix H 142 may be modified from encoder-optimized parity-check matrix H 112.

LDPC codes are usually represented by bipartite graphs including two sets of nodes. One set of nodes, the variable or bit nodes, corresponds to elements of the codeword, and the other set of nodes, the check nodes, corresponds to the set of parity-check constraints satisfied by the codeword. The connections between the variable nodes and the check nodes are defined by the parity-check matrix H (e.g., parity-check matrix 142 of FIG. 1). A check node can receive messages from one or more variable nodes and return an updated message. The messages between the variable nodes and the check nodes can be in the form of LLR values. In a min-sum (MS) decoder, the updated message can include the minimum values of the received messages.

Further details of LDPC decoding can be found in U.S. patent application Ser. No. 15/903,604, entitled "MIN-SUM DECODING FOR LDPC CODES," filed Feb. 23, 2018, now U.S. Pat. No. 10,680,647, which is assigned to the assignee hereof and expressly incorporated by reference herein in its entirety.

In various embodiments, the system shown may be implemented using a variety of techniques, including an application-specific integrated circuit (ASIC), a field-programmable gate array (FPGA), and/or a general-purpose processor (e.g., an Advanced RISC Machine (ARM) core).

LDPC codes are usually represented by bipartite graphs. One set of nodes, the variable or bit nodes, corresponds to elements of the codeword and the other set of nodes, the check nodes, corresponds to the set of parity-check constraints satisfied by the codewords. Typically the edge connections are chosen at random. The error correction capability of an LDPC code is improved if cycles of short length are avoided in the graph. In a (r,c) regular code, each of the n variable nodes (V1, V2, ..., Vn) has connections to r check nodes and each of the m check nodes (C1, C2, ..., Cm) has connections to c bit nodes. In an irregular LDPC code, the check node degree is not uniform. Similarly, the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a codeword by p results in another codeword. Here p is the size of square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

Figures 2A, 2B:
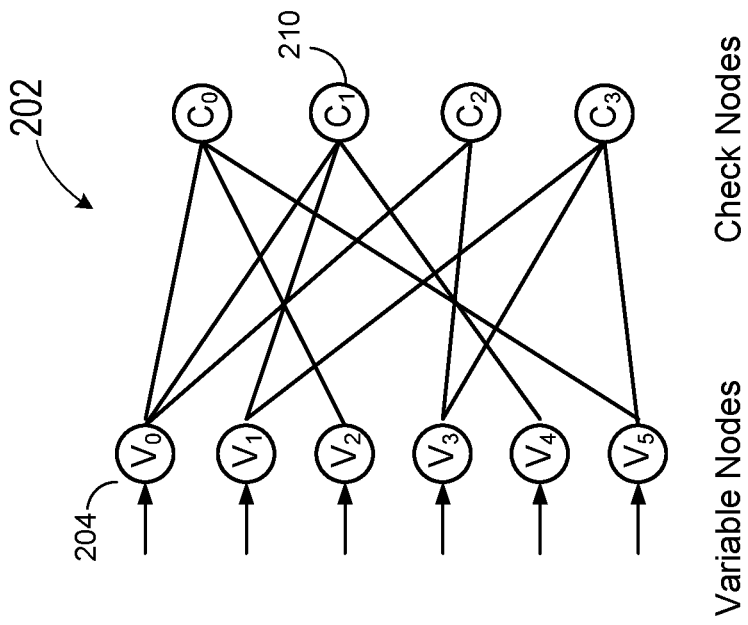
FIG. 2A illustrates an example parity-check matrix and FIG. 2B illustrates an example bipartite graph corresponding to the parity-check matrix in accordance with certain embodiments of the present disclosure.

FIG. 2A illustrates an example parity-check matrix H 200 and FIG. 2B illustrates an example bipartite graph corresponding to the parity-check matrix 200, in accordance with certain embodiments of the present disclosure. In this example, the parity-check matrix 200 has six column vectors and four row vectors. Network 202 shows the network corresponding to the parity-check matrix 200 and represents a bipartite graph. Various type of bipartite graphs are possible, including, for example, a Tanner graph.

Generally, the variable nodes in the network 202 correspond to the column vectors in the parity-check matrix 200. The check nodes in the network 202 correspond to the row vectors of the parity-check matrix 200. The interconnections between the nodes are determined by the values of the parity-check matrix 200. Specifically, a "1" indicates that the corresponding check node and variable nodes have a connection. A "0" indicates that there is no connection. For example, the "1" in the leftmost column vector and the second row vector from the top in the parity-check matrix 200 corresponds to the connection between the variable node 204 and the check node 210.

A message-passing algorithm is generally used to decode LDPC codes. Several variations of the message-passing algorithm exist in the art, such as MS algorithm, scaled MS algorithm, or the like. In general, any of the variations of the message-passing algorithm may be used in an LDPC decoder without departing from the teachings of the present disclosure. Message passing uses a network of variable nodes and check nodes, as shown in FIG. 2B. The connections between variable nodes and check nodes are described by and correspond to the values of the parity-check matrix 200, as shown in FIG. 2A.

A hard-decision message-passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide whether the bit at their position should be a zero or a one by a majority rule. The variable nodes then send this hard-decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword as further illustrated in the next figures. It should be noted that a soft-decision decoder works similarly; however, each of the messages that are passed among check nodes and variable nodes also include reliability of each bit.

An example message-passing algorithm may be performed. In this example, L(qij) represents a message that is sent by variable node $v_i$ to check node $c_j$; L($r_{ji}$) represents the message sent by check node $c_j$ to variable node $v_i$; and WO represents initial LLR value for each variable node $v_i$. Variable node processing for each L(qij) can be done through the following steps:
(1) Read L($c_i$) and L($r_{ji}$) from memory.
(2) Calculate L(Qi-sum)=L($c_i$)+Scaling Factor*$\Sigma_{j' \in c_i}$L($r_{ji}$).
(3) Calculate each L(Qi-sum)−L($r_{ij}$).
(4) Output L(Qi-sum) and write back to memory.
(5) If this is not the last column of the memory, go to Step 1 and increment i by one.
(6) Compute parity-check-sums (e.g., syndrome). If they are all equal to zero, the number of iterations reaches a threshold, and the parity-checksums are greater than another threshold, or the number of iterations equals a maximum limit, stop; otherwise, perform check node processing.

Check node processing for each L(rji) can be performed as follows:
(1) Read one row of qij from memory.
(2) Calculate L(Rj-sum) as follows:

$$L(Rj\text{-sum})=(\Pi_{i' \in R_j}\alpha_{i'j})\varphi(\Sigma_{i' \in R_j}\varphi(\beta_{i'j}))$$

$$\alpha_{ij}=\text{sign}(L(q_{ij})), \beta_{ij}=|L(q_{ij})|,$$

$$\varphi(x) = -\log\left(\tanh\left(\frac{x}{2}\right)\right) = \log\left(\frac{e^x + 1}{e^x - 1}\right)$$

(3) Calculate the individual L($r_{ji}$)=$(\Pi_{i' \in R_{j\setminus i}}\alpha_{i'j})\varphi(\Sigma_{i' \in R_{j\setminus i}}\varphi(\beta_{i'j}))$ for check nodes.
(4) Write back L($r_{ji}$) to memory.
(5) If this is not the last row of memory, then go to the first step and increment j by one.

Figure 3:
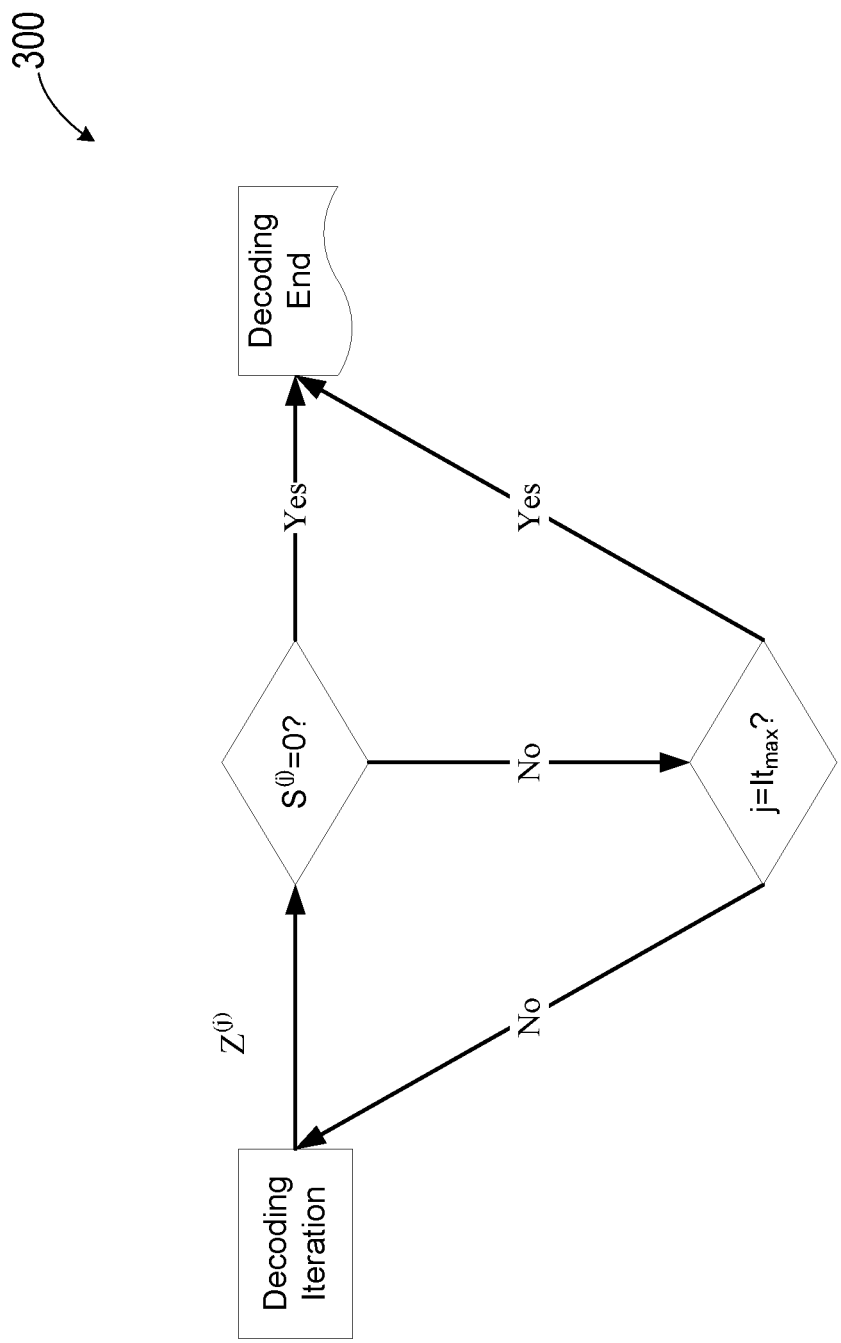
FIG. 3 illustrates an example diagram for terminating an LDPC iterative decoding based on a syndrome and maximum number of iterations in accordance with certain embodiments of the present disclosure.

FIG. 3 illustrates an example diagram 300 for terminating an LDPC iterative decoding based on a syndrome and maximum number of iterations, in accordance with certain embodiments of the present disclosure. The termination depends on either the syndrome of a codeword being a zero or the number of iterations reaching the maximum number.

As illustrated in diagram 300, suppose that x=[$x_0$, $x_1$, ..., $x_{N-1}$] is a bit vector, and H=[$h_{i,j}$] is an M×N LDPC matrix with a binary value $h_{i,j}$ at the intersection of row i and column j. Then each row of H provides a parity check for x. If x is a codeword of H, $xH^T$=0 because of the LDPC code construction. Assume that x is transmitted over a noisy channel, and the corrupted channel output is y=[$y_0$, $y_1$, ..., $y_{N-1}$] and its hard decision is z=[$z_0$, $z_1$, ..., $z_{N-1}$]. The syndrome of z is a binary vector calculated by s=[$s_0$, $s_1$, ..., $s_{N-1}$]=$zH^T$, with a weight of $\|s\|$. The weight of $\|s\|$ represents the number of unsatisfied check nodes and is also called the checksum since $$\|s\| = \sum_{i=0}^{M-1} s_i.$$

Suppose that $z^{(j)}$=[$z_0$, $z_1$, ..., $z_{N-1}$] is the hard decision of the j-th iteration and the syndrome vector of the j-th iteration is $s^{(j)}$=[$s_0^{(j)}$, $s_1^{(j)}$, ..., $s_{N-1}^{(j)}$]=$z^{(j)}H^T$. Then $\|s\|^{(j)}$ is the checksum of the j-th iteration.

As further illustrated in diagram 300, the iterative decoding is terminated either when the checksum is zero (shown with $s^{(j)}$=0), or when the checksum is non-zero and the iteration number reaches the predefined maximal iteration number (shown with j=$It_{max}$, where "$It_{max}$" is the maximum number of iterations). Otherwise, the iterative decoding is repeated.

Figure 4:
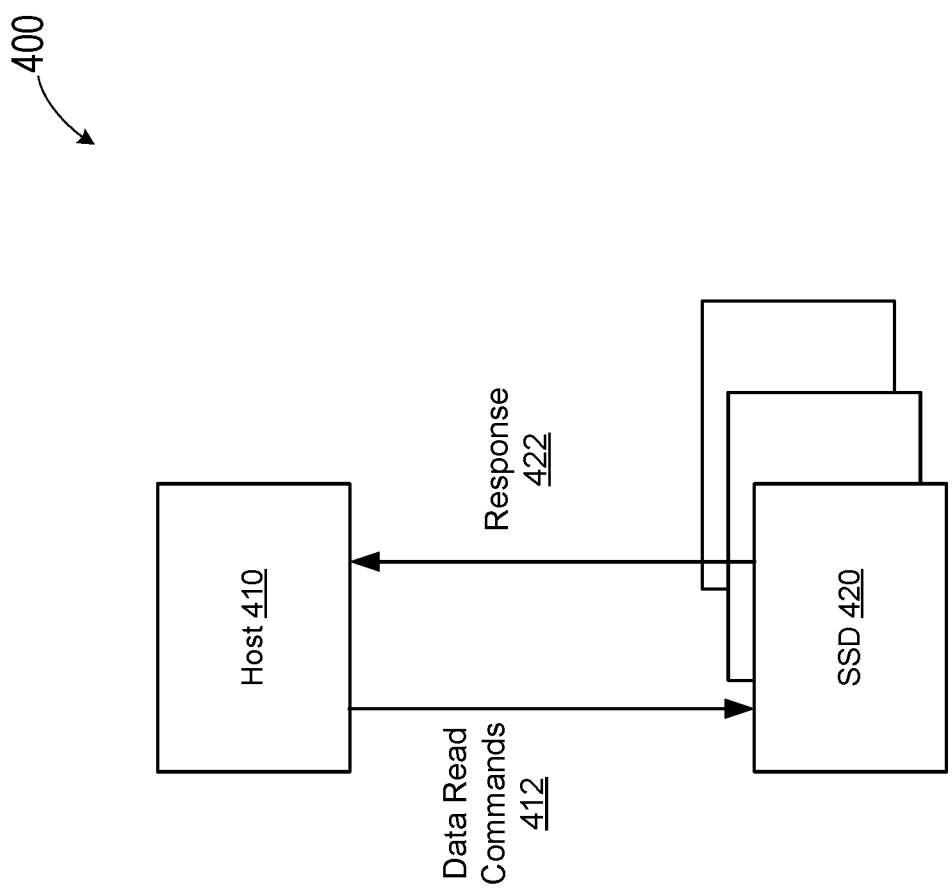
FIG. 4 illustrates an example architecture of a computer system 400 in accordance with certain embodiments of the present disclosure.

FIG. 4 illustrates an example architecture of a computer system 400 in accordance with certain embodiments of the present disclosure. In an example, the computer system 400 includes a host 410 and one or more SSDs 420. Each solid-state disk (SSD) can be a storage system, which can include memory cells and a memory controller coupled to the memory cells for controlling operations of the memory cells. An example of a storage system is described below in connection with FIG. 9. Each memory cell can be an m-bit multi-level cell (MLC), where m is an integer. In some embodiments, as illustrated below in FIGS. 3, 4, and 6, the memory cells are arranged in m pages, each of the m bits of a given memory cell providing data for a corresponding one of the m pages.

The host 410 stores data on behalf of clients in the SSDs 420. The data is stored in an SSD as codewords for ECC protection. For instance, the SSD can include an ECC encoder (e.g., the LDPC encoder 110 of FIG. 1).

The host 410 can receive a client's request for the client's data stored in the SSDs 420. In response, the host sends data read commands 412 to the SSDs 420 as applicable. Each of such SSDs 420 processes the received data read command and sends a response 422 to the host 410 upon completion of the processing. The response 422 can include the read data and/or a decoding failure. In an example, each of the SSDs includes an ECC decoder (e.g., the LDPC decoder 140 of FIG. 1). Processing the data read command and sending the response 422 includes decoding by the ECC decoder the codewords stored in the SSD to output the read data and/or the decoding failure. The ECC decoder can include multiple decoders implementing message-passing algorithms, such as the MS algorithm.

Generally, an SSD can be a storage device that stores data persistently or caches data temporarily in non-volatile semiconductor memory and is intended for use in storage systems, servers (e.g., within data centers), and direct-attached storage (DAS) devices. A growing number of applications need high data throughput and low transaction latency, and SSDs are used as a viable storage solution to increase the performance, efficiency, reliability, and lowering of overall operating expenses. SSDs generally use NAND flash memory and deliver higher performance and consume less power than spinning hard-disk drives (HDDs). NAND flash memory has a number of inherent issues associated with it; the two most important include a finite life expectancy as NAND flash cells wear out during repeated writes, and a naturally occurring error rate. SSDs can be designed and manufactured according to a set of industry standards that define particular performance specifications, including latency specifications, to support heavier write workloads, more extreme environmental conditions, and recovery from a higher bit error rate (BER) than a client SSD (e.g., personal computers, laptops, and tablet computers).

In the following description, techniques for improving LLR determination in a multi-level memory device are described. These techniques are applicable to any soft decoder that uses LLR in decoding.

Figure 5:
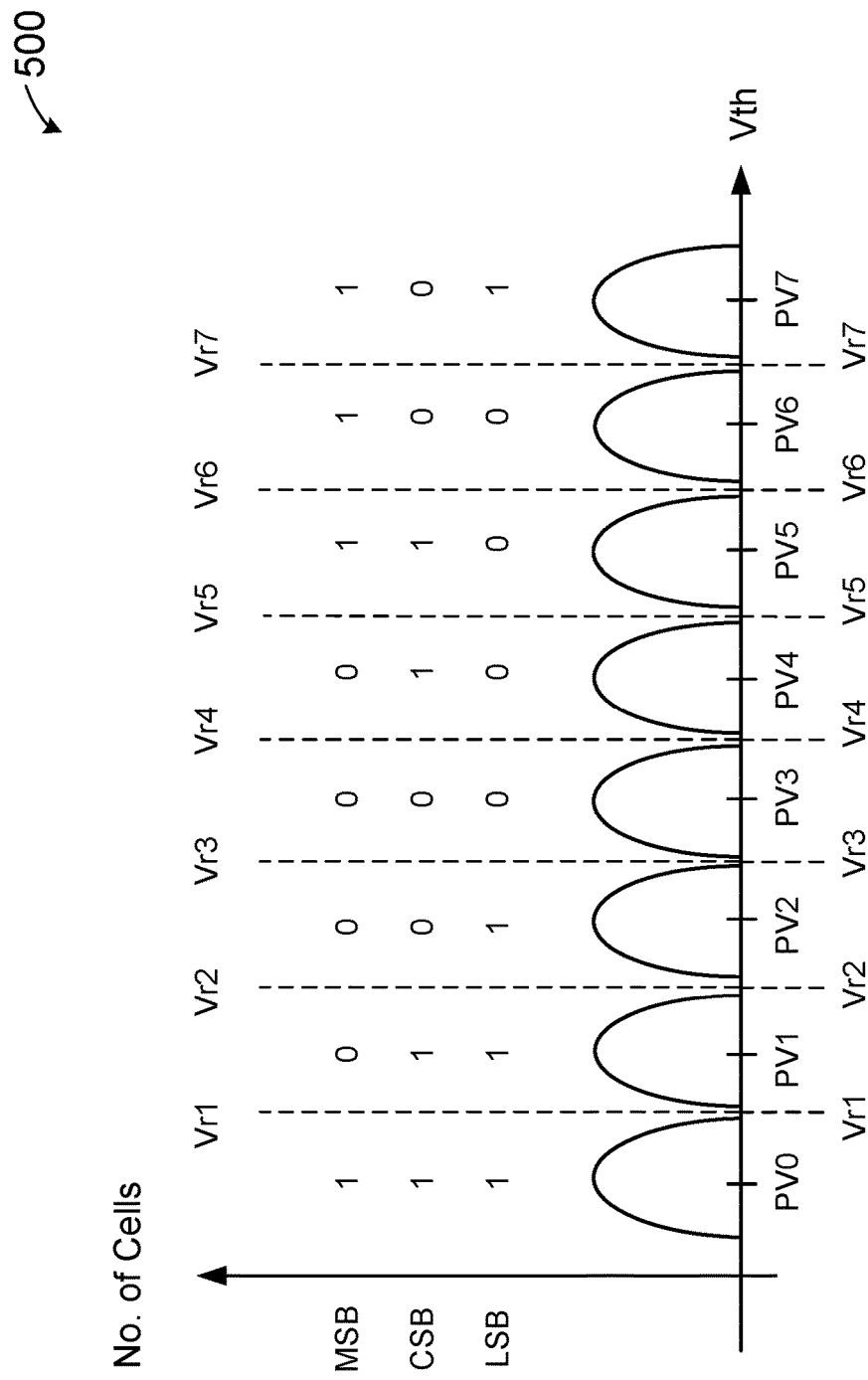
FIG. 5 is a simplified diagram illustrating a distribution of cell voltages of a memory device having a 3-bit tri-level cell (TLC) in a flash memory device in accordance with certain embodiments of the present disclosure.

FIG. 5 is a simplified diagram 500 illustrating a distribution of cell voltages of a memory device having a 3-bit TLC in a flash memory device, according to some embodiments of the present invention. Flash memory stores multiple bits per cell by modulating the cell into different states or PV levels using a programming operation. Data can be read from NAND flash memory by applying read reference voltages onto the control gate of each cell to sense the cell's threshold voltage. For TLC flash, there are eight PV levels and each level corresponds to a unique 3-bit tuple. The first, second, and third bits of the cells are grouped together into least significant bit (LSB), center significant bit (CSB), and most significant bit (MSB) pages respectively as shown in FIG. 5.

In FIG. 5, the target cell PV for an erase state is shown as "PV0," and the PVs for seven programmed states are shown as "PV1" to "PV7." The distribution of cell voltages, or cell threshold voltages, for each of eight data states is represented as a bell-shaped curve associated with each PV. The spread in cell threshold voltage can be caused by differences in cell characteristics and operation history. In FIG. 5, each cell is configured to store eight data states represented by three bits: an MSB, a CSB, and an LSB. Also shown in FIG. 5 are seven read thresholds, labeled as "Vr1," "Vr2," . . . , and "Vr7," which are used as reference voltages to determine the data stored in the memory cell. For example, two thresholds, Vr1 and Vr5, are used to read the MSB. If the voltage stored by the cell (the PV) is less than Vr1 or is greater than Vr5, then the MSB is read as a 1. If the voltage is between Vr1 and Vr5, then the MSB is read as a 0. Two thresholds, Vr3 and Vr7, are used to read the LSB. If the voltage stored by the cell is less than Vr3 or is greater than Vr7, then the LSB is read as a 1. If the voltage is between Vr3 and Vr7, then the LSB is read as a 0. Similarly, three thresholds, Vr2, Vr4, and Vr6, are used to read the CSB.

Figure 6:
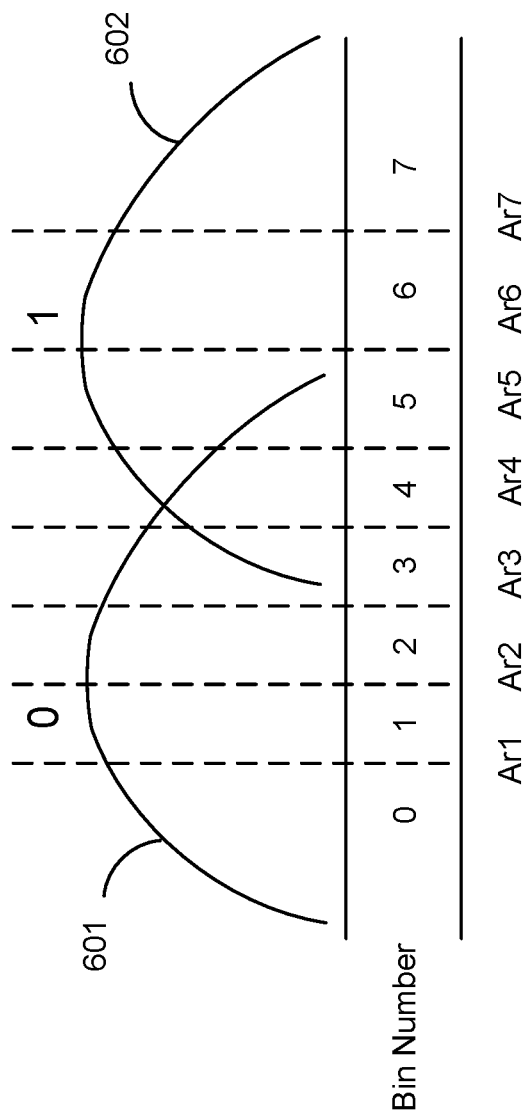
FIG. 6 is a simplified diagram illustrating LLR determination based on a distribution of cell voltages of a memory device having adjacent programmed voltage (PV) levels in a flash memory device in accordance with certain embodiments of the present disclosure.

FIG. 6 is a simplified diagram illustrating LLR determination based on a distribution of cell voltages of a memory device having adjacent PV levels in a flash memory device according to some embodiments of the present invention. For example, in FIG. 6, the cell PVs of level 0 and level 1 are shown as distribution 601 and 602, respectively. Multiple read operations using different AR threshold voltages (Ar1-Ar7) are carried out to divide the cells into different bins, with bin numbers 0-7. The AR threshold voltages can be selected to facilitate the determination of LLRs. Flash cells that fall into the same bin can be assumed to have the same threshold voltage and are thus mapped to the same LLR values, which correspond to respective voltage sub-regions. In the example of FIG. 6, with eight bins corresponding to respective voltage sub-regions, the LLR can be expressed in three bits. In some embodiments, 3-bit LLR values can be represented by 000, 001, 010, . . . , and 111.

Figure 7:
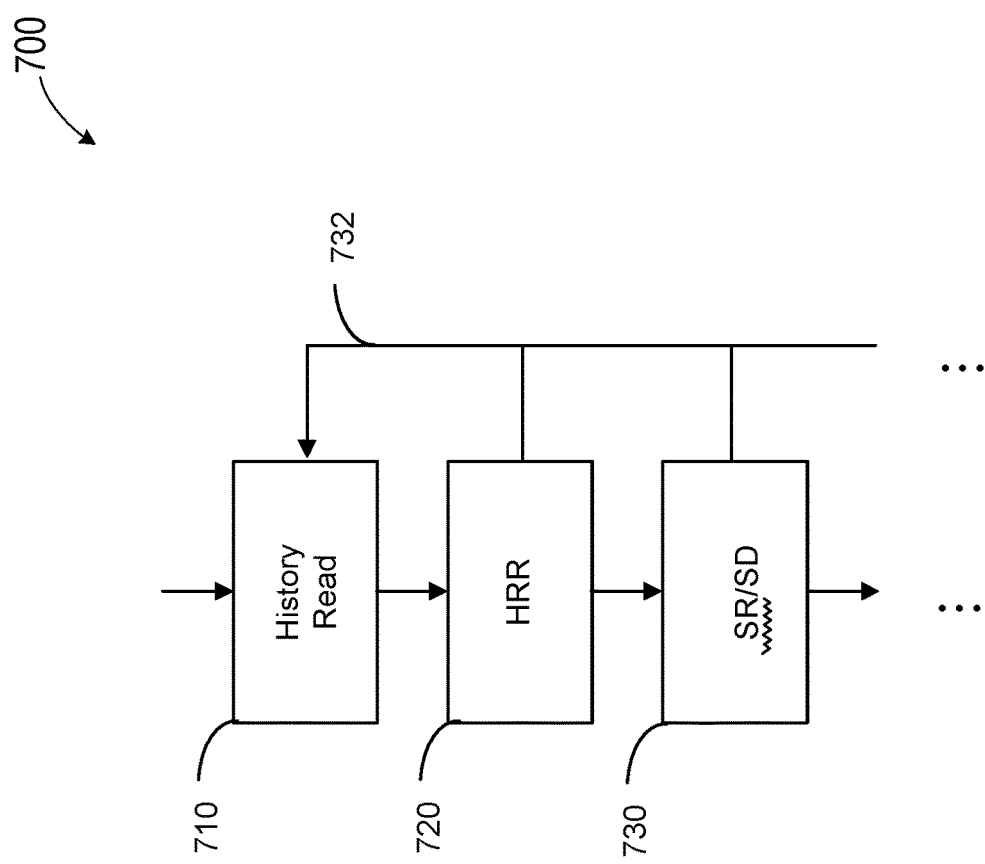
FIG. 7 is a simplified flowchart illustrating a method for operating a storage system in accordance with certain embodiments of the present disclosure.

FIG. 7 is a simplified flow diagram illustrating a method for decoding in a storage system. In NAND flash storage systems, after a read command is received, a sequence of data recovery steps is often executed with the aim of retrieving noise-free data from the NAND flash storage systems. At 710, these data recovery steps can include a hard decoding process and a soft decoding process. The hard decoding process can include a series of hard reads, which can include a first hard read and one or more hard re-reads. The first hard read attempt is sometimes known as the "history read." In an example, the history read uses the Vt threshold that was used in a previous successful read, in which the decoder succeeded to recover the noise-free data from the NAND page flash storage systems. The history read information is maintained separately per physical block or physical die and will be updated if decoding fails and a different Vt is used in later steps, which leads to a successful decoding. Therefore, the history read represents a first read attempt in response to a new read command. If the history read fails, re-reads or read retries are carried out. This re-read or read retry is sometimes known as the high-priority read retry (HRR).

At 720, HRR can include re-reads using a series of predetermined fixed Vt thresholds that remain the same through the lifetime of the NAND flash storage systems. For example, there can be five to ten HRR read attempts performed before the next step is taken. For each HRR read, a decode operation is carried out.

The system can perform multiple reads to find the best center Vt for soft read. For example, the system can find a center Vt at the minimal of the valley in a distribution of read data. The hard decoding can be carried out using, for example, MS hard decoding or bit-flipping (BF) hard decoding.

If all HRR reads fail, it can be determined that the hard decoding has failed, and soft decoding 730 is started. In the first part of soft read and soft decoding (SR/SD) 730, the system finds a center Vt, which is the optimal Vt for separating two states, and then places additional Vt's around the center Vt for additional ARs to generate LRR for each of the bins. AR threshold voltages can be identified. All the read attempts before soft read generate noisy hard read information, which can be used with the AR information to generate LLRs for soft decoding. As shown by label 732, the successful Vt is updated as history read.

In embodiments of the invention, a method is described for generating the LLRs using information from hard decoding without the ARs that are used in soft decoding. At each read attempt before soft read, a certain Vt is used to read data from NAND. A method for generating the LLR table is described to use information generated during hard reads to generate LLRs to support early-stage soft decoding. The previous hard read data is combined with current hard read data to generate LLRs and feed into a soft-input decoder. This process can take place for the hard read except for the first hard read (history read), and improve the error correction capability of the decoder in the hard reads.

There are two issues in existing systems to support the early-stage soft decoding described above. The first challenge is that there is no easy way to come up with the LLR table to support early-stage soft decoding in existing decoding flow. The second issue is that in order to differentiate read commands that are the first reads or those that are re-reads (in the second reads and beyond), the data path has to provide an interface signal to inform the LLR generation module. This can complicate data-path design and make the LLR generation and ECC modules less modular and more difficult to support different applications.

Embodiments of the invention includes a machine-learning-based LLR generation scheme with re-read detection. A machine-learning-based method is used for early-stage LLR table generation with re-read detection. The optimal LLR table is chosen based on the Vt's used in previous read attempts, and also the checksums and one's counts information. Further, a command detection module is used to detect whether the read command is a first read or a re-read, without extra signaling from the data path to the LLR generation module.

The inventors have observed a large variation of the optimal Vt across all different word lines (WLs) from various physical locations on the wafer, retention conditions, and also read disturb counts. For example, in a TLC storage, each physical page is divided into three logical pages: MSB, CSB, and LSB, as described above. To read voltages in LSB, 11000011 needs two threshold voltages: V2 and V6. The inventors have observed large variations of V2 and V6 according to page locations, start of life, end of life, erase-write counts, etc. Therefore, the read voltages need to be optimized for each page and over the lifetime of the storage device.

Because of such variation, when a hard read is performed from history read, depending on which WL is being read, different bit errors may be obtained. Large variations have also been observed for the re-reads which follow predetermined read threshold voltages. Therefore, a static LLR table is not adequate. In embodiments of this invention, the LLR table can be updated by what has been observed in every single particular WL. In some embodiments, a WL is associated with a page of cells.

In soft decoding, soft information such as LLR is generated using AR with read threshold voltages selected for effective LLR generation. LLR generation is difficult for early-stage soft decoding because the AR is not available at early-stage reads. The consequence is that the PV distributions at different valleys will be mixed together without AR. The shape and position of each PV play a role when deciding the optimal LLR table. Also, there is no guarantee that one Vt will be always be on the left/right of another Vt. Further, a randomness is involved in the Vt's used in early-stage hard reads. In early-stage hard reads, the read threshold Vt's are determined by history read and HRR entries, which are preselected, can be arbitrary, and may not reflect the current state of the cells relative to the underlying PVs. Without knowing the underlying PV distribution, it is difficult to determine a good LLR table given certain particular Vt's used in previous reads.

Some embodiments of the invention provide a method and a storage system for error-correction decoding that includes generating LLRs for soft decoding using information only from hard decoding and without using ARs that are used in conventional soft decoding. In some embodiments, the storage system includes memory cells and a memory controller coupled to the memory cells for controlling operations of the memory cells, including hard decoding and soft decoding of LDPC codewords. Examples of such storage systems are described below in connection with FIGS. 13 and 14. The memory controller is configured to perform hard decoding of codewords in a page, the hard decoding including a first hard read and one or more re-reads using predetermined hard read threshold voltages. The memory controller is also configured to group memory cells in the page into a plurality of bins based on the read threshold voltages for the first hard read and the one or more re-reads, and to compute parity checksum and one's count for memory cells in each bin. The memory controller is further configured to determine LLR for each bin of memory cells based on read data, checksums, and one's count for each bin. In some embodiments, the memory controller can include LLR generation blocks, as described below in connection to FIG. 8. The method for LLR generation is further explained with reference to the flow chart in FIG. 9.

Figure 8:
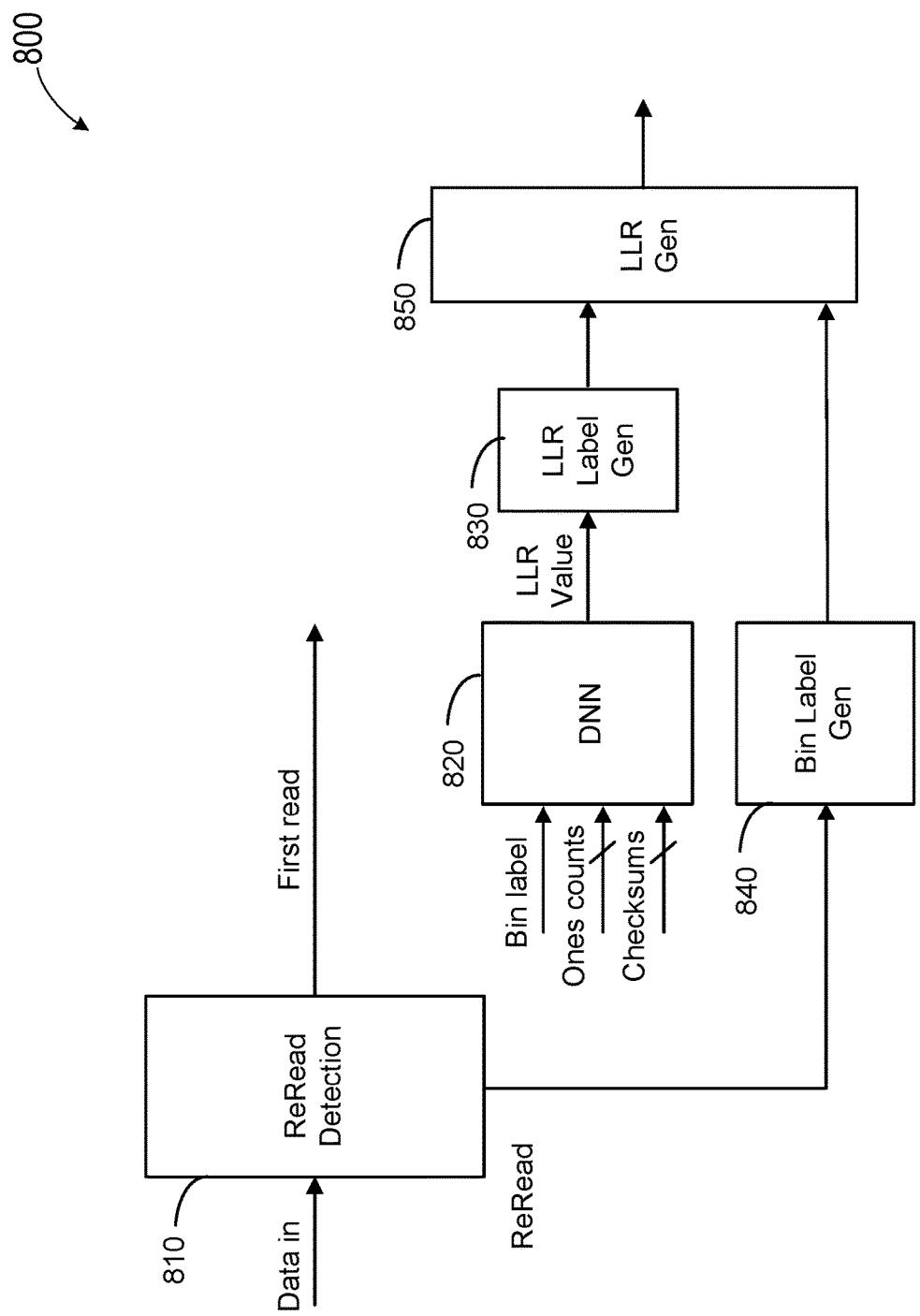
FIG. 8 is a simplified block diagram illustrating LLR generator in accordance with certain embodiments of the present disclosure.

FIG. 8 is a simplified block diagram illustrating an LLR generator, according to some embodiments of the present invention. FIG. 8 shows a system 800 for LLR generation that can be part of a decoder for a storage system. As shown in FIG. 8, LLR generator 800 includes a re-read detection unit 810, a DNN unit 820, an LLR table generation unit 830, a bin label generation unit 840, and an LLR generation unit 850. The operation of LLR generator 800 for LLR generation is further explained with reference to the flow chart in FIG. 9.

Figure 9:
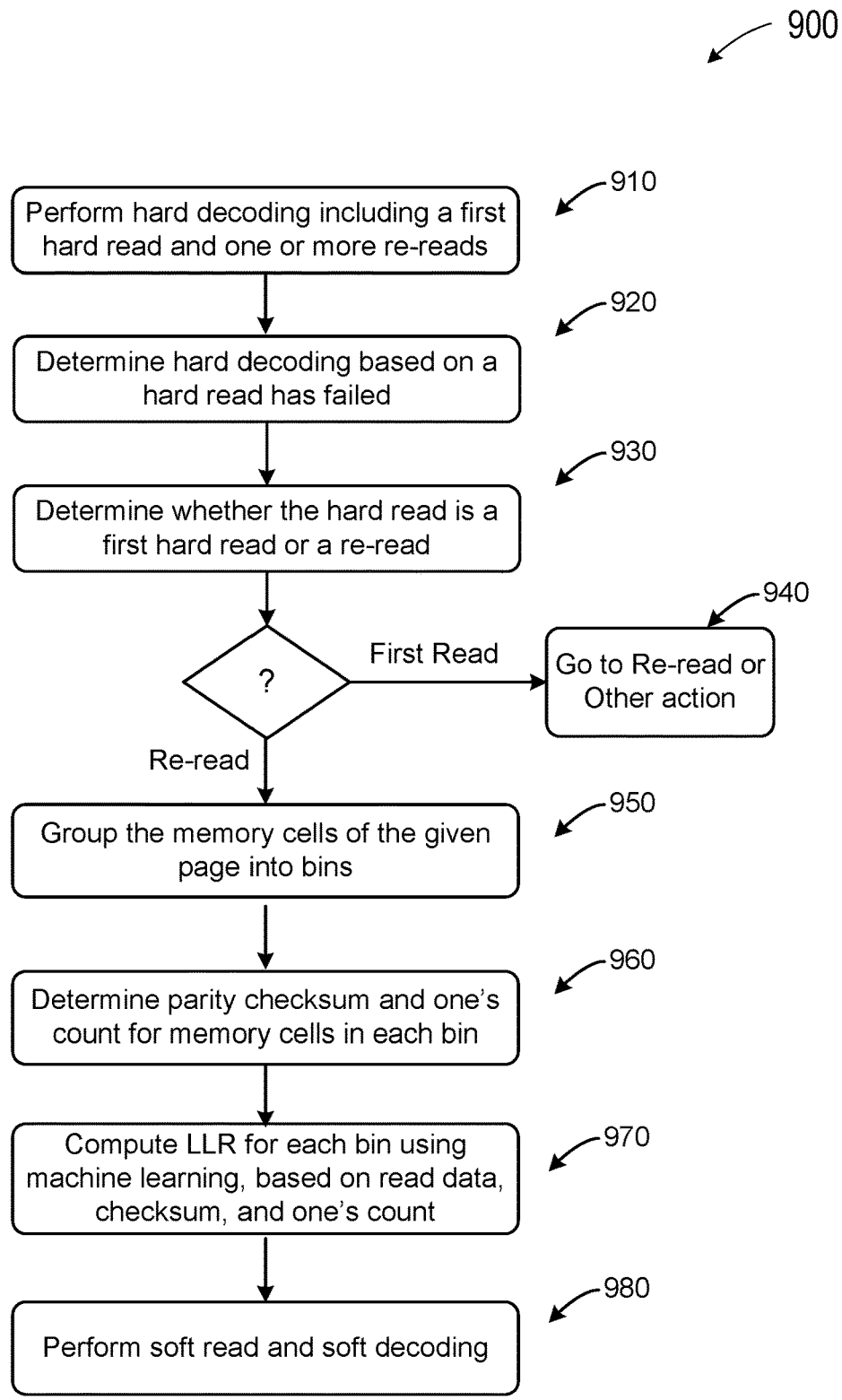
FIG. 9 is a simplified flowchart illustrating a method for LLR generation as implemented in decoding LDPC codewords in accordance with certain embodiments of the present disclosure.

FIG. 9 is a simplified flowchart illustrating a method for LLR generation as implemented in decoding LDPC codewords according to some embodiments of the present invention. Method 900 is described below with reference to LLR generator 800 in FIG. 8 and an example illustrated in FIG. 10. As shown in FIG. 8, the method of decoding LDPC codewords includes, at 910, performing, by a system that comprises an LDPC decoder, hard decoding of a given page of memory cells associated with a WL. Examples of a system that comprises an LDPC decoder are described in connections to FIGS. 1-4 and FIGS. 13-14. The hard decoding can include a first hard read and one or more re-reads using predetermined hard read threshold voltages.

At 920, the method includes determining, by the system, that hard decoding based on a hard read has failed. If a hard decoding is successful, the system can proceed to read and decode other pages in the storage system. On the other hand, if the hard decoding has failed, the conventional approach is usually to perform re-reads or hard read retries, and then to proceed to soft decoding. The soft decoding generally includes determining LLRs by using ARs followed by soft read soft decoding. However, as explained above, in the early stages of decoding, it is often difficult to obtain information for soft decoding. In embodiments of the invention, LLRs can be generated based on hard re-read information.

At 930, the system determines whether the hard read is the first hard read or a re-read of the given page. This is because the first hard read does not produce enough information for effective LLR generation. Therefore, this method of LLR generation is applied to only hard re-reads. In this regard, the re-read detection unit 810 in FIG. 8 determines whether the current hard read is a first hard read or a re-read of the given page. In some embodiments, the system has a "current read" buffer storing the hard read data for a read that fails in previous read(s) and is yet to be re-read. In order to detect if a read command is a first read or re-read, a pattern-matching process is used to calculate the similarity between incoming_data and the data stored in the current read buffer. In an embodiment, the pattern matching process can be implemented using a summing operation as follows:

SUM(XOR(incoming_data, saved_data)), where:

incoming_data is read data from the current hard read of the given page;

saved_data is read data from the previous hard read of the given page;

XOR is an exclusive OR operation; and

SUM is an operation that determines a sum of 1's bits.

As an example, a page can have 4K bytes of memory cells and a codeword can have 256 bits. Then the pattern matching expression is as follows:

sum(xor(incoming_data(0:255), saved_data(0:255))).

The pattern-matching operation effectively sums up the number of 1's in the comparison of the incoming data and the saved data. In other words, the sum is the number of matched bits between the incoming data and the saved data. In general, the raw BER of a page is less than 1%. Therefore, the data pattern in the re-read data should be similar across multiple reads. On the other hand, a random codeword will likely match the data in the current read buffer with about 50% probability. Therefore, if the coming data is for a different page than the saved data, the sum could be 128 or 50%, with codeword length of 256 bits. If the coming data is for a re-read of the same page as the saved data, the sum should be low, for example, 1%. In an embodiment, a pattern matching can be declared if the percentage of bits matched is higher than, for example, 75%, or 192 bits out of 256 bits. Once pattern matching is declared, a read count is updated to indicate how many reads have been performed for this codeword.

At 940, upon determining that the hard read is a first read and not a re-read, proceed to re-read. As explained above, the first hard read does not produce enough information for effective LLR generation. Since the hard read has failed, the system may proceed to re-read. Alternatively, the system may proceed to other actions. In some embodiments, for the first read, the system may perform a hard decoding for the page, with the sign of the LLR determined by read data and the magnitude set to some fixed value.

At 950, upon determining that the hard read is a re-read of the given page, the memory cells of the given page are grouped into bins based on read threshold voltages associated with the hard read and previous hard reads of the given page. The bin label generation unit 840 in FIG. 8 is used to generate labels for each bin.

Figure 10:
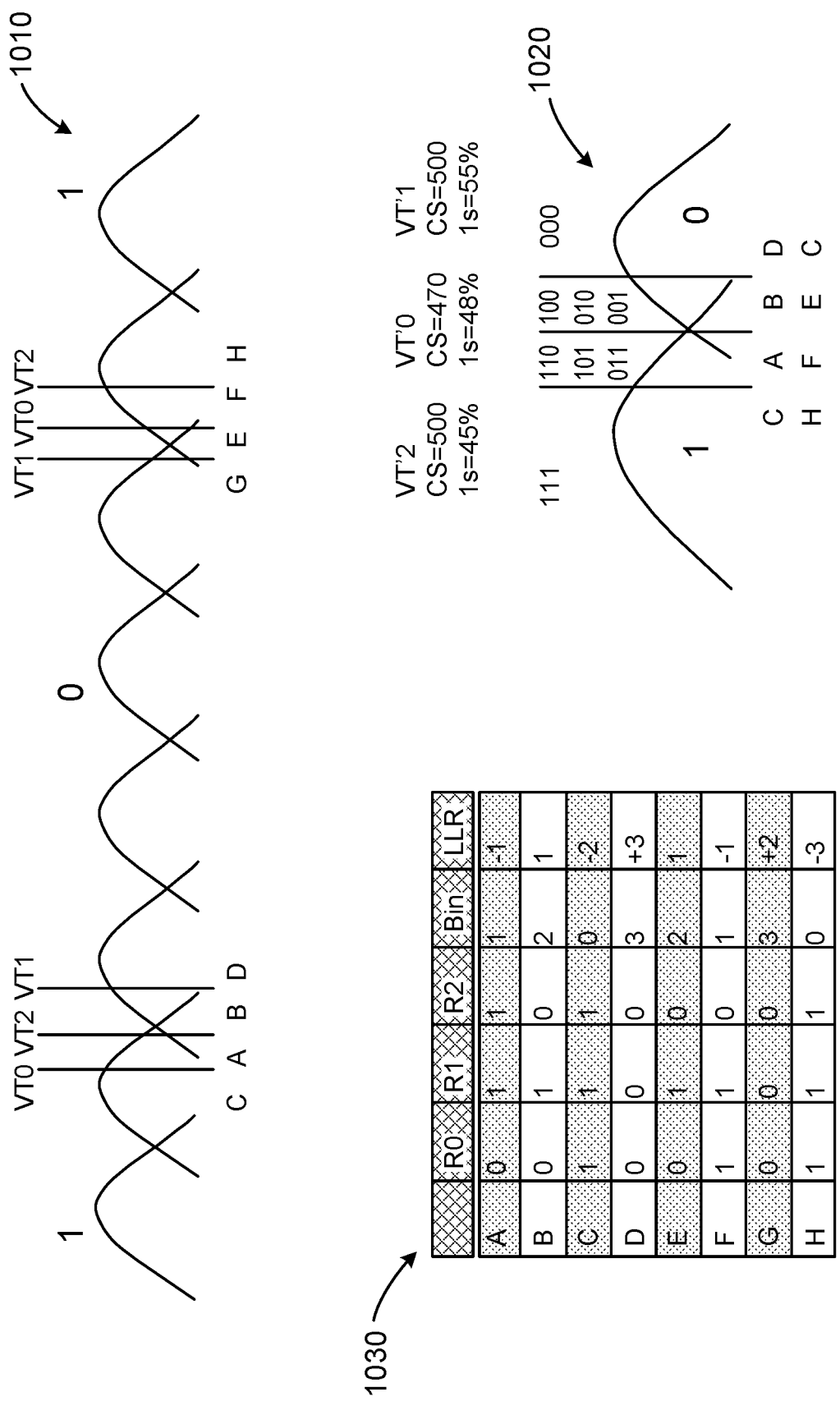
FIG. 10 shows three simplified diagrams illustrating an example of generating LLRs using checksums and one's counts in accordance with certain embodiments of the present disclosure.

FIG. 10 shows three simplified diagrams illustrating an example of generating LLRs using checksums and one's counts, according to some embodiments of the present invention. Diagram 1010 illustrates a distribution of cell voltages of a memory device having a 3-bit TLC in a flash memory device, according to some embodiments of the present invention. Similar to the TLC cell voltage distribution in FIG. 5, diagram 1010 shows eight PV level. As explained above in connection with FIG. 5, two or three read threshold voltages are used to determine bit values for MSB, CSB, and LSB. In diagram 1010, two read threshold voltages labeled VT0 are used in a first hard read, two read threshold voltages labeled VT1 are used for a first re-read, and two read threshold voltages labeled VT2 are used for a second re-read. VT0, VT1, and VT2 are preselected for the hard read. After the second re-read, the cells can be clustered according to their PV levels into eight groups, represented by cells A, B, C, D, E, F, G, and H, respectively.

At 960, the system determines the parity checksum and one's count for memory cells in each bin. In embodiments of the invention, the parity checksum is based on weights of a non-zero syndrome of the codewords. For a noisy parity-check matrix, all the parity-check equations that are not satisfied contribute a "1," and those that are parity check satisfied contribute a "0." In linear code like LDPC, even if the decoding is not successful, useful information can still be derived from the checksum, which can provide information about how many errors exist. For example, given two reads, both of which may not produce the correct codeword, the information that one of the codewords has more errors than the other one can be useful in the decoding, for example, in determining the next Vt, calculating LLR, etc. More details of parity checksum are described above in connection with FIGS. 1-3.

The one's count is the number of cells in each bin that have cell values of 1. In a storage system in which the data is randomized before it is written, it is expected that the number of is and the number of 0s will be about 50% of the data bits. Both the parity checksum and the one's count can be used in determining the LLR values for a given bin. For example, a smaller parity checksum indicates fewer errors and can suggest a higher likelihood. Further, if the ratio of one's count is close to 50%, it can suggest a higher likelihood.

In the example of diagram 1010, three reads have been performed on one of the TLC pages. The hard read information is used to generate 3-bit LLR, which can have values from −3 to +3. Diagram 1020 illustrates an example in which three conceptual Vt's are imposed on a single-level cell (SLC) model. Each Vt is associated with its checksum and percentage of one's count. As shown in diagram 1020, certain cells will fall into the same conceptual bin and hence be assigned the same bin label. For example, cells C and H are grouped in bin #0, cells A and F are grouped into bin #1, cells B and E are grouped into bin #2, and cells D and G are grouped into bin #3. As shown, the read value of 111 could be in bin C or bin H, and there is not enough information to distinguish between bins C and H without an AR in the conventional LLR generation method for soft decoding.

In the example of diagram 1020, the first hard read associated with read threshold voltage VT0 is characterized by a parity checksum (CS) of 470 and a one's count percentage of 48%. Similarly, the first re-read associated with read threshold voltage VT1 is characterized by a parity CS of 500 and a one's count percentage of 55%. Further, the second re-read associated with read threshold voltage VT2 is characterized by a parity CS of 500 and a one's count percentage of 45%. As explained above, a smaller parity CS suggests a higher likelihood, and a ratio of one's count close to 50% suggests a higher likelihood. Because the Vt ordering may vary at different valleys, the values of Vt's are not used to generate the LLR values.

Diagram 1030 is an example of LLR values generated using the method outlined above. In diagram 1030, the eight cells are listed as A, B, C, D, E, F, G, and H, and the three hard operations are designated as R0, R1, and R2. Diagram 1030 also lists bin numbers BIN and LLR values. The hard read data for each cell is determined using read threshold voltage VT0 for hard read operation R0, read threshold voltage VT1 for hard read operation R1, and read threshold voltage VT2 for hard read operation R2. Diagram 1030 lists the hard read data for each cell as follows: A(011), B(010), C(111), D(000), E(010), F(110), G(000), and H(111). The LLR value for each cell can be determined with the information provided by the checksum and one's count as follows: A(−1), B(1), C(−2), D(+3), E(1), F(−1), G(+2), and H(−3).

Thus, in embodiments of the invention, information generated in hard reads can be used to generate LLR values without the need to use ARs. Information such as read data, parity checksum, and one's count (or percentage of one's count) can be used to estimate LLRs. For example, statistical distribution of cell values can be correlated with the read data, checksum, and one's count. This information can be used to estimate LLRs. The result can be included in a lookup LLR table for use in soft decoding.

As shown at 970 in the flowchart of FIG. 9, embodiments of the invention include a method for computing LLR for each bin using machine learning, based on read data, checksum, and one's count for each bin. An example of machine learning is NN-based learning. In the example of FIG. 8, DNN unit 820 receives the read count of current read, one's counts, and checksums to generate LLR values. Therefore, the one's count and checksum are stored for all previous read attempts and increase read count by one for every read.

In this example, DNN 820 is used to decide what LLR value needs to be assigned given the bin label at a particular read count. Depending on the read count of the current read, the dimension of one's counts and checksums may vary. The inference will be performed once for every bin label value at the beginning of the LLR generation process, and the association between bin labels and LLR values are stored in the LLR table. During LLR generation, the LLR table will be repeatedly applied on the fly to generate new LLR values and feed to the decoder. In some embodiments, NNs can be applied to perform the offline machine learning. An example of NN is described below with reference to FIG. 11.

Referring back to the flowchart of FIG. 8, at 980, soft read and soft decoding of the given page are performed. Examples of soft decoding are described above with reference to FIGS. 1-4.

In the scheme in FIG. 8, the DNN inference will be performed multiple times, where each time the LLR value for a particular bin label is generated from the DNN. This approach has the advantage of reducing the size of the DNN and may be applied to product lines with loose quality of service (QoS) requirements. For enterprise applications that have tight QoS requirements, a parallel DNN-based LLR generator may be desirable. Some examples are shown in FIG. 11.

Figure 11:
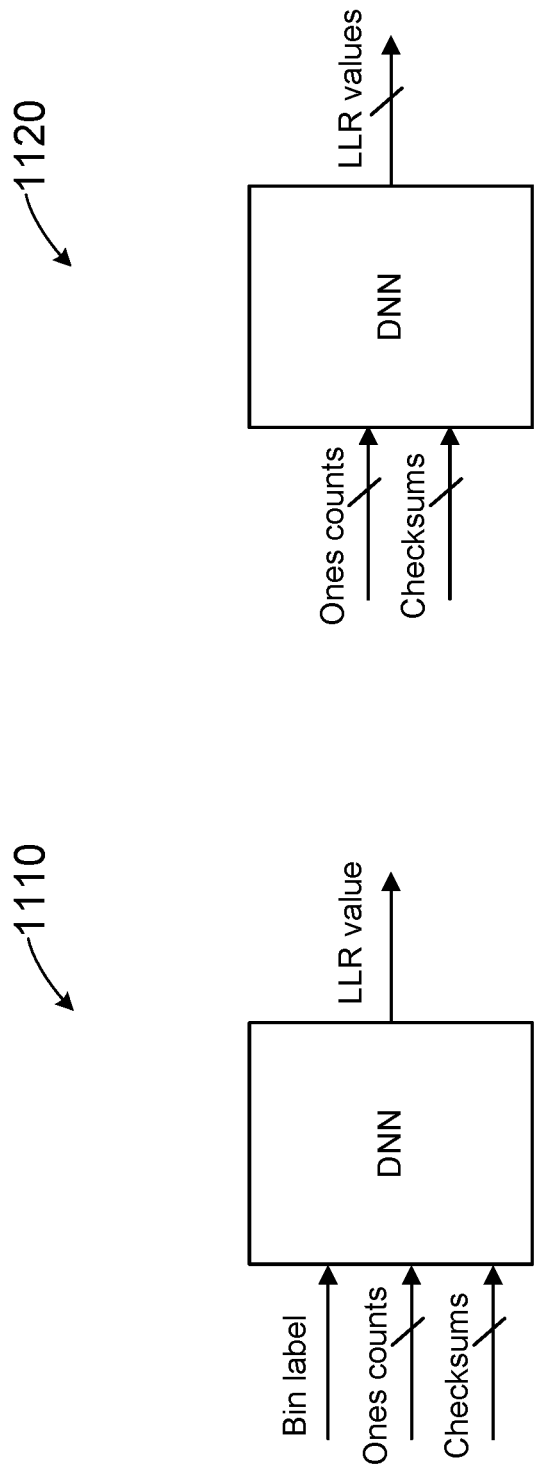
FIG. 11 illustrates a block diagram for a serial DNN-based LLR generator and a block diagram for a parallel DNN-based LLR generator in accordance with certain embodiments of the present disclosure.

FIG. 11 illustrates a block diagram for a serial DNN-based LLR generator and a block diagram for a parallel DNN-based LLR generator according to embodiment of the present invention. As shown in FIG. 11, 1110 is a serial DNN-based LLR generator that computes LLRs for each bin label with bin label as an input, as well as one's counts and checksums. In FIG. 11, 1120 is a parallel DNN-based LLR generator that computes LLRs for all bins simultaneously. DNN 1120 receives one's counts and checksums as input. The parallel DNN-based LLR generator is faster but more complicated.

Figure 12:
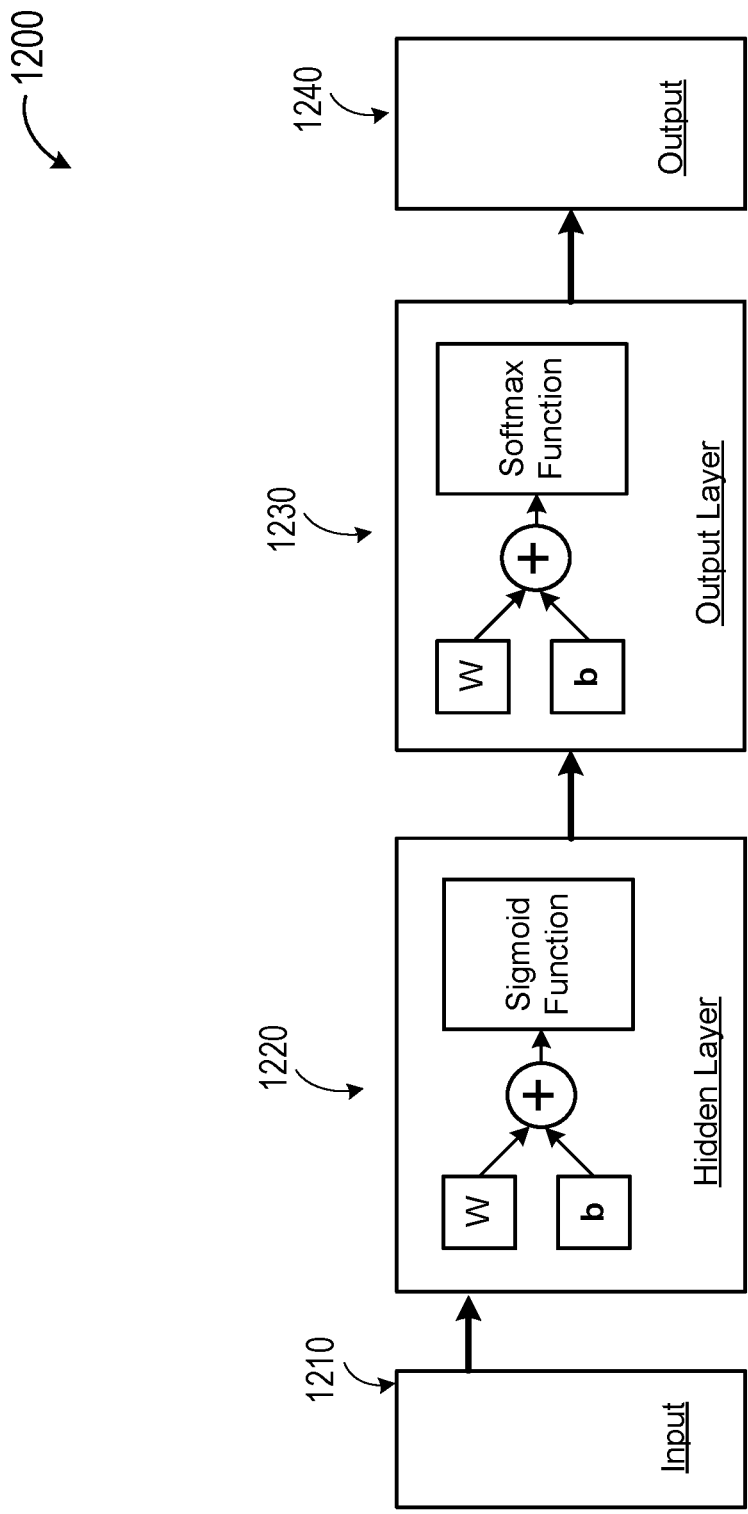
FIG. 12 is a block diagram illustrating an exemplar two-layer feed-forward NN that can also be used in the NN unit of FIG. 8 for LLR generation in accordance with certain embodiments of the present disclosure.

FIG. 12 is a block diagram illustrating an exemplar two-layer feed-forward NN that can also be used in DNN unit 820 of FIG. 8 for LLR generation, according to embodiments of the present invention. In the example shown in FIG. 12, feed-forward NN 1200 includes an input port 1210, a hidden layer 1220, an output layer 1230, and an output port 1240. In this network, the information moves in only one direction—forward—from the input nodes, through the hidden nodes, and to the output nodes. In FIG. 12, W represents a weighting vector and b represents a bias factor.

In some embodiments, the hidden layer 1220 can have sigmoid neurons, and the output layer 1230 can have softmax neurons. A sigmoid neuron has an output relationship defined by a sigmoid function, which is a mathematical function having a characteristic S-shaped curve or sigmoid curve. Sigmoid functions have a domain of all real numbers, with return value monotonically increasing most often from 0 to 1, or alternatively from −1 to 1, depending on the application. A wide variety of sigmoid functions can be used as the activation function of artificial neurons, including the logistic and hyperbolic tangent functions.

In the output layer 1230, a softmax neuron has an output relationship defined by a softmax function. The softmax function, or normalized exponential function, is a generalization of the logistic function that "squashes" a K-dimensional vector z of arbitrary real values to a K-dimensional vector σ (z) of real values, where each entry is in the range (0, 1), and all the entries adds up to 1. The output of the softmax function can be used to represent a categorical distribution—that is, a probability distribution over K different possible outcomes. The softmax function is often used in the final layer of an NN-based classifier. In FIG. 12, W represents a weighting vector and b represents a bias factor.

An NN having many hidden layers is sometimes referred to as a DNN. In some embodiments, the NN is a DNN that receives checksums and one's counts as inputs and determines weighting factors for computing optimal LLRs.

To achieve reasonable classification, ten or more neurons can be assigned in the first hidden layer. If more hidden layers are used, any number of neurons can be used in the additional hidden layer. Given more computing resources, more neurons or layers can be assigned. By providing enough neurons in its hidden layer, the performance can be improved. More complicated networks (e.g., convolutional NN or recurrent NN) can also be applied to achieve better performance. Given enough neurons in its hidden layer, it can classify vectors arbitrarily well.

Figure 13:
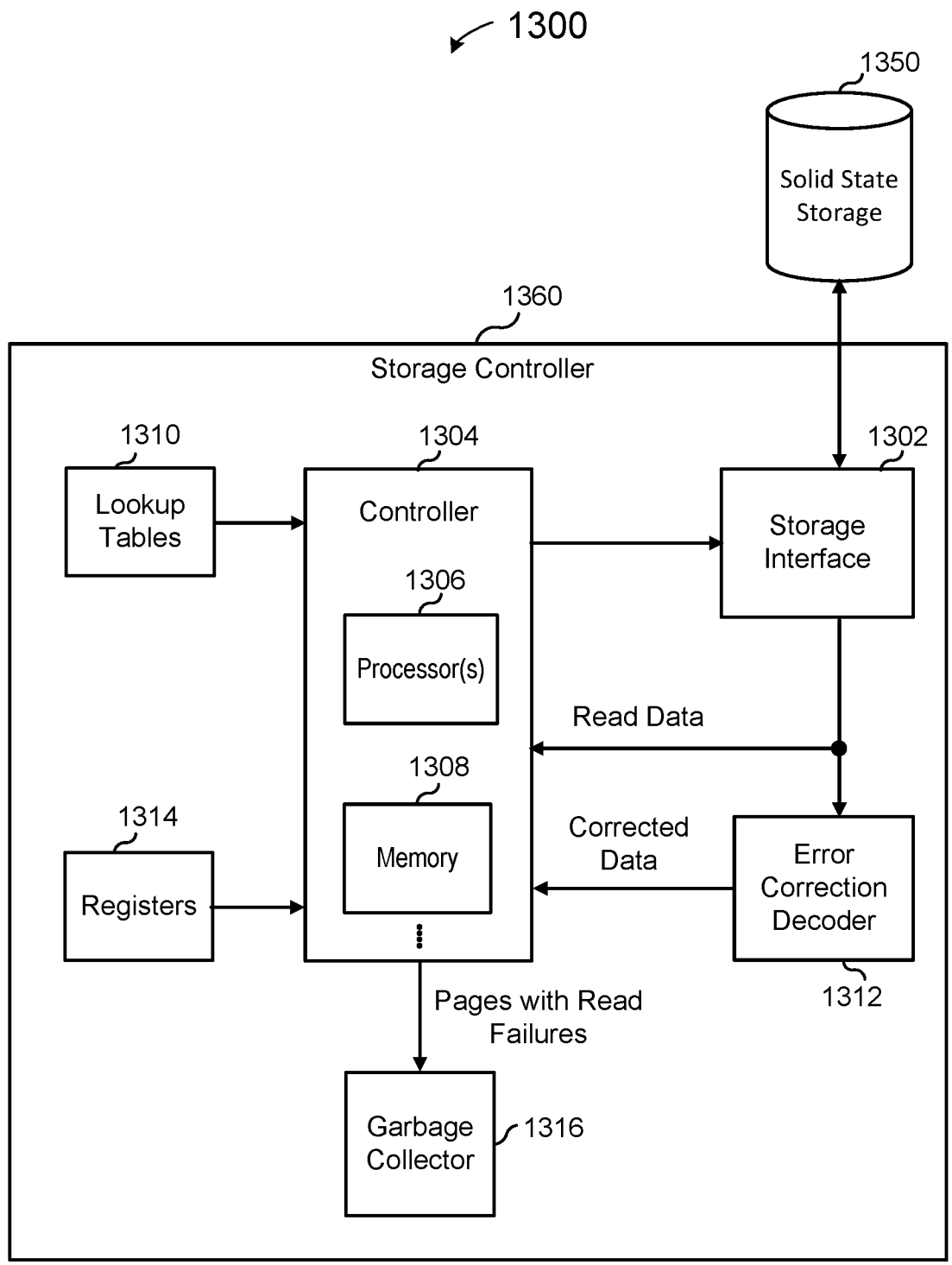
FIG. 13 is a simplified block diagram illustrating a solid-state storage system in accordance with certain embodiments of the present disclosure.

FIG. 13 is a simplified block diagram illustrating a solid-state storage system, in accordance with certain embodiments of the present disclosure. As shown, solid-state storage system 1300 can include a solid-state storage device 1350 and a storage controller 1360. Storage controller 1360, also referred to as a memory controller, is one example of a system that performs the techniques described herein. In some embodiments, storage controller 1360 can be implemented on a semiconductor device, such as an ASIC or FPGA. Some of the functions can also be implemented in firmware or software.

Controller 1304 can include one or more processors 1306 and memories 1308 for performing the control functions described above. Storage controller 1360 can also include lookup tables 1310, which can include a table for degraded blocks and a table for bad blocks, etc. Registers 1314 can be used to store data for control functions, such as threshold values for degraded block counts, etc.

Controller 1304 can be coupled to solid-state storage 1350 through a storage interface 1302. Error-correction decoder 1312 (e.g., an LDPC decoder or a BCH decoder) can perform error-correction decoding on the read data and sends the corrected data to controller 1304. Controller 1304 can identify the pages with read failures to garbage collector 1316, which performs corrective processing on those pages (e.g., by copying the data, with or without error correction decoding, to a new location).

Figure 14:
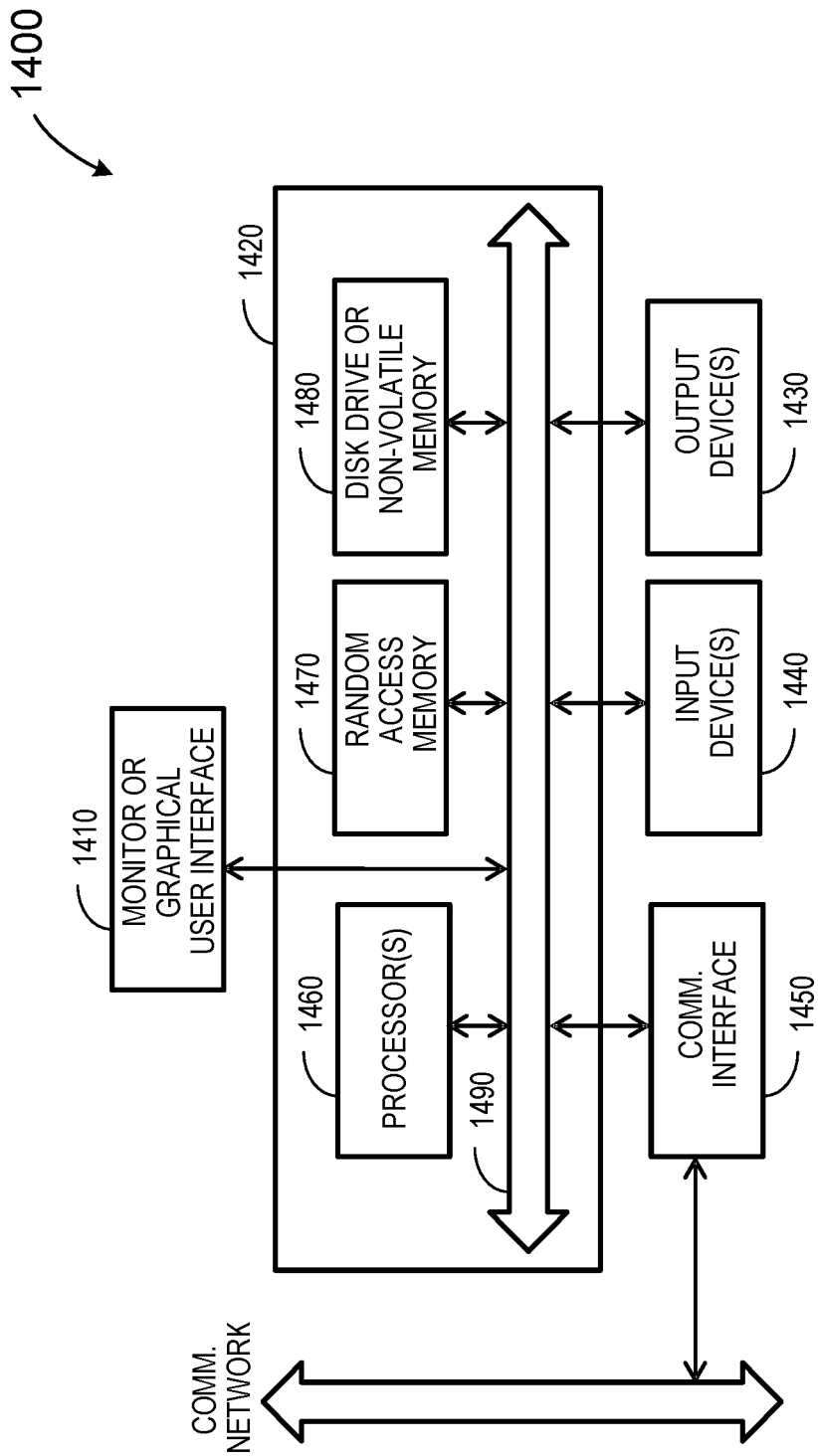
FIG. 14 is a simplified block diagram illustrating an apparatus that may be used to implement various embodiments in accordance with certain embodiments of the present disclosure.

FIG. 14 is a simplified block diagram illustrating an apparatus that may be used to implement various embodiments, according the present disclosure. FIG. 14 is merely illustrative of an embodiment incorporating the present disclosure and does not limit the scope of the invention as recited in the claims. One of ordinary skill in the art would recognize other variations, modifications, and alternatives. In one embodiment, computer system 1400 typically includes a monitor 1410, a computer 1420, user output devices 1430, user input devices 1440, communications interface 1450, and the like.

As shown in FIG. 14, computer 1420 may include a processor(s) 1460 that communicates with a number of peripheral devices via a bus subsystem 1490. These peripheral devices may include user output devices 1430, user input devices 1440, communications interface 1450, and a storage subsystem, such as RAM 1470 and disk drive 1480. As an example, a disk drive can include SSD implemented with non-volatile memory devices such as SSD 220 depicted in FIG. 2 or storage device 900 depicted in FIG. 9 with features described above.

User input devices 1440 include all possible types of devices and mechanisms for inputting information to computer system 1420. These may include a keyboard, a keypad, a touch screen incorporated into the display, audio input devices such as voice recognition systems, microphones, and other types of input devices. In various embodiments, user input devices 1440 are typically embodied as a computer mouse, a trackball, a trackpad, a joystick, a wireless remote, a drawing tablet, a voice command system, an eye-tracking system, and the like. User input devices 1440 typically allow a user to select objects, icons, text, and the like that appear on the monitor 1410 via a command such as a click of a button or the like.

User output devices 1430 include all possible types of devices and mechanisms for outputting information from computer 1420. These may include a display (e.g., monitor 1410), non-visual displays such as audio output devices, etc.

Communications interface 1450 provides an interface to other communication networks and devices. Communications interface 1450 may serve as an interface for receiving data from and transmitting data to other systems. Embodiments of communications interface 1450 typically include an Ethernet card, a modem (telephone, satellite, cable, integrated services digital network (ISDN)), (asynchronous) digital subscriber line (DSL) unit, FireWire interface, USB interface, and the like. For example, communications interface 1450 may be coupled to a computer network, to a FireWire bus, or the like. In other embodiments, communications interfaces 1450 may be physically integrated on the motherboard of computer 1420 and may be a software program, such as soft DSL or the like.

In various embodiments, computer system 1400 may also include software that enables communications over a network such as the Hypertext Transfer Protocol (HTTP), the Transmission Control Protocol and the Internet Protocol (TCP/IP), the Real Time Streaming Protocol and Real-time Transport Protocol (RTSP/RTP), and the like. In alternative embodiments of the present invention, other communications software and transfer protocols may also be used, for example Internetwork Packet Exchange (IPX), User Datagram Protocol (UDP), or the like. In some embodiments, computer 1420 includes one or more Xeon microprocessors from Intel as processor(s) 1460. Further, in one embodiment, computer 1420 includes a UNIX-based operating system.

RAM 1470 and disk drive 1480 are examples of tangible media configured to store data such as embodiments of the present invention, including executable computer code, human-readable code, or the like. Other types of tangible media include floppy disks, removable hard disks, optical storage media such as CD-ROMS, DVDs and bar codes, semiconductor memories such as flash memories, non-transitory read-only memories (ROMs), battery-backed volatile memories, networked storage devices, and the like. RAM 1470 and disk drive 1480 may be configured to store the basic programming and data constructs that provide the functionality of the present invention.

Software code modules and instructions that provide the functionality of the present invention may be stored in RAM 1470 and disk drive 1480. These software modules may be executed by processor(s) 1460. RAM 1470 and disk drive 1480 may also provide a repository for storing data used in accordance with the present invention.

RAM 1470 and disk drive 1480 may include a number of memories including a main RAM for storage of instructions and data during program execution and a ROM in which fixed non-transitory instructions are stored. RAM 1470 and disk drive 1480 may include a file storage subsystem providing persistent (non-volatile) storage for program and data files. RAM 1470 and disk drive 1480 may also include removable storage systems, such as removable flash memory.

Bus subsystem 1490 provides a mechanism for letting the various components and subsystems of computer 1420 communicate with each other as intended. Although bus subsystem 1490 is shown schematically as a single bus, alternative embodiments of the bus subsystem may utilize multiple busses. Bus system 1490 may be a PCI Express bus that may be implemented using PCIe PHY embodiments of the present disclosure.

FIG. 14 is representative of a computer system capable of embodying the present invention. It will be readily apparent to one of ordinary skill in the art that many other hardware and software configurations are suitable for use with the present invention. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation; Solaris from Sun Microsystems; LINUX; UNIX; and the like. In still other embodiments, the techniques described above may be implemented upon a chip or an auxiliary processing board.

Various embodiments of the present invention can be implemented in the form of logic in software or hardware or a combination of both. The logic may be stored in a computer-readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs, DVDs, or other media, now known or later developed, that are capable of storing code and/or data. Hardware modules or apparatuses described herein include, but are not limited to, ASICs, FPGAs, dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes.

The methods and processes disclosed herein may be embodied using a combination of code, data, and hardware modules or apparatuses.

The embodiments disclosed herein are not to be limited in scope by the specific embodiments described herein. Various modifications of the embodiments of the present invention in addition to those described herein will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that the invention's usefulness is not limited thereto and that the embodiments of the present invention can be beneficially implemented in any number of environments for any number of purposes.

What is claimed is:

1. A method of decoding low-density parity-check (LDPC) codewords, the method comprising:
    performing, by a system that comprises an LDPC decoder, hard decoding of a given page of memory cells associated with a word line (WL), the hard decoding including a first hard read and one or more re-reads using predetermined hard read threshold voltages;
    determining, by the system, that hard decoding based on a hard read has failed;
    determining, by the system, whether the hard read is the first hard read or a re-read of the given page;
    upon determining that the hard read is the first hard read, proceeding to perform hard decoding of another page;
    upon determining that the hard read is the re-read of the given page,
        grouping the memory cells of the given page into bins based on read threshold voltages associated with the hard read and previous hard reads of the given page;
        determining parity checksum and one's count for memory cells in each bin;
        computing a log likelihood ratio (LLR) for each bin using machine learning, based on read data, checksum, and one's count for each bin; and
        performing soft decoding of the given page using the computed LLRs.

2. The method of claim 1, further comprising detecting whether a hard read is a first hard read or a re-read using a pattern-matching operation between read data from a current hard read and a previous hard read of the given page.

3. The method of claim 2, wherein the pattern-matching operation comprises performing a summing operation as follows:
    SUM(XOR(incoming_data, saved_data)),
    wherein:
        incoming_data is read data from the current hard read of the given page;
        saved_data is read data from the previous hard read of the given page;
        XOR is an exclusive OR operation; and
        SUM is an operation that determines a sum of 1's bits.

4. The method of claim 1, wherein the parity checksum is based on weights of a non-zero syndrome of the codewords.

5. The method of claim 1, wherein using machine learning comprises using a neural network (NN).

6. The method of claim 5, wherein the NN is a deep neural network (DNN) that receives checksums and one's counts as inputs and determines weighting factors for computing optimal LLRs.

7. A method for determining LLR for soft decoding based on information obtained from hard decoding, in a storage system configured to perform hard decoding and soft decoding of LDPC codewords, the method comprising:
    performing hard decoding of codewords in a page, the hard decoding including a first hard read and one or more re-reads using predetermined hard read threshold voltages;
    grouping memory cells in the page into a plurality of bins based on the read threshold voltages for the first hard read and the one or more re-reads;
    computing parity checksum and one's count for memory cells in each bin;
    determining LLR for each bin of memory cells based on read data, checksums, and one's count for each bin.

8. The method of claim 7, further comprising using machine learning to determine the LLR for each bin.

9. The method of claim 8, wherein the machine learning comprises NN.

10. The method of claim 8, wherein the parity checksum comprises weights of a non-zero syndrome of the codewords for LDPC decoding.

11. The method of claim 8, wherein the one's count for a given bin comprises a number of memory cells in the bin that have cell values of 1.

12. The method of claim 7, further comprising determining the LLR without using an assist read (AR), wherein the AR comprises determining an additional read threshold voltage for determining the LLR according to read data from hard reads.

13. The method of claim 7, further comprising detecting whether a hard read is a first hard read or a re-read using a pattern-matching operation between read data from a current hard read and a previous hard read of the given page.

14. The method of claim 13, further comprising determining LLR for soft decoding based on information obtained from hard decoding after determining that a hard read of a given page is a re-read of the given page.

15. A storage system, including memory cells and a memory controller coupled to the memory cells for controlling operations of the memory cells, including hard decoding and soft decoding of LDPC codewords, wherein the memory controller is configured to:
    perform hard decoding of codewords in a page, the hard decoding including a first hard read and one or more re-reads using predetermined hard read threshold voltages;
    group memory cells in the page into a plurality of bins based on the read threshold voltages for the first hard read and the one or more re-reads;
    compute parity checksum and one's count for memory cells in each bin;
    determine LLR for each bin of memory cells based on read data, checksums, and one's count for each bin.

16. The storage system of claim 15, wherein the memory controller is further configured to use deep neural network (DNN) to determine the LLR for each bin.

17. The storage system of claim 15, wherein the parity checksum comprises weights of a non-zero syndrome of the codewords for LDPC decoding.

18. The storage system of claim 15, wherein the one's count for a given bin comprises a number of memory cells in the bin that have cell values of 1.

19. The storage system of claim 15, further comprising:
    a re-read detection unit configured to detect whether a hard read is a first hard read or a re-read using a pattern-matching operation between read data from a current hard read and a previous hard read of a given page; and an LLR generation unit configured to determine LLR for soft decoding based on information obtained from hard decoding after determining that a hard read of a given page is a re-read of the given page.

20. The storage system of claim 19, wherein the pattern-matching operation comprises performing a summing operation as follows:

SUM(XOR(incoming_data, saved_data)), wherein:
incoming_data is read data from the current hard read of the given page;
saved_data is read data from the previous hard read of the given page;
XOR is an exclusive OR operation; and
SUM is an operation that determines a sum of 1's bits.

* * * * *